United States Patent [19]

Villeret et al.

[11] 4,044,306

[45] Aug. 23, 1977

[54] DIGITAL CONVERTER FROM PULSE CODE MODULATION TO CONTINUOUS VARIABLE SLOPE DELTA MODULATION

[75] Inventors: Michel Villeret, Sherbrooke; Hubert Stéphenne, Rock Forest; Pierre A. Deschênes, Sillery, all of Canada

[73] Assignee: Universite de Snerbrooke, Sherbrooke, Canada

[21] Appl. No.: 492,022

[22] Filed: July 26, 1974

[51] Int. Cl.² .......................................... H03K 13/24
[52] U.S. Cl. ..................... 325/38 B; 340/347 DD; 179/15 AP
[58] Field of Search ........... 340/347 DD; 179/15 AP, 179/15 AV; 325/38 R, 38 B

[56] References Cited

U.S. PATENT DOCUMENTS

| 3,750,144 | 7/1973 | Bolus et al. ................ 340/347 DD |
| 3,772,678 | 11/1973 | Deschenes et al. ........ 340/347 DD |
| 3,825,831 | 7/1974 | Ishiguro ...................... 325/38 B |
| 3,831,167 | 8/1974 | Tewksbury ................. 325/38 B |

OTHER PUBLICATIONS

Cummiskey et al, "Adaptive Quantization in Differential PCM—," Bell System Tech. Journal, vol. 52, No. 7, Sept. 1973, pp. 1105-1118.
Published Patent Application No. B295,674, McDonald, Jan., 1975.

Primary Examiner—Thomas J. Sloyan

[57] ABSTRACT

A digital converter for digitally converting a coded signal being at a PCM rate into another coded signal flowing at a delta rate. First, the code of the PCM signal is converted into an intermediate code, this intermediate code being at a rate corresponding to the PCM rate. Then, the rate of the intermediate coded signal is converted into the rate of the delta signal. And, finally, the code of the intermediate signal is changed into the code of the delta signal.

10 Claims, 11 Drawing Figures (PRIOR ART) Fig. 1A (PRIOR ART) Fig. 1B

DIGITAL CONVERTER FROM PULSE CODE MODULATION TO CONTINUOUS VARIABLE SLOPE DELTA MODULATION

The present invention relates to a method and a system for digitally converting a coded signal flowing at a predetermined rate into another coded signal flowing at another predetermined rate, the two coded signals respectively belonging to two different signal transmission systems. In particular, the converting system of the invention realizes the adaptation of a pulse code modulation (PCM) system to a continuous variable slope delta modulation (CVSD) system.

Most particularly, the present method and system permit the linkage of PCM systems within a telecommunication network provided with delta modulation systems. The converter of the invention is entirely digital and allows the convertion of PCM signals into delta signals, which are widely used in telephony. The converter of the invention will be hereinafter designated as a DDMC.

Delta modulation and PCM are two different manners of digitally representing an analog signal. Both transmit only samples of the input signal and thus information on the signal is available only at sampling time. Those two systems present basic differences: they do not use the same digital code to transmit the information on the samples and they operate at different sampling rates. Therefore, a delta decoder receiving a binary PCM sequence is unable to reconstruct the analog signal for two reasons: as sampling rates are different, the delta decoder is not looking for the information at the right time, and as the codes are different, the decoder cannot "understand" the meaning of the binary words it is receiving.

A prime object of the present invention is to provide a system capable of interfacing between two systems, the respective signals of which are differently coded and sampled. This is achieved through the use of a DDMC which realizes a code conversion and a sampling rate conversion.

According to the invention, the method for converting the code and the sampling rate of a first signal into the code and the sampling rate of a second signal is carried out by means of a first code conversion unit which receives the first signal and converts its code into an intermediate code, the rate of the intermediate code being the rate of the first signal; a rate conversion unit connected to the first code conversion unit for converting the rate of the intermediate signal into the rate of the second signal; and a second code conversion unit which receives the intermediate signal and converts its code into the second signal code.

Thus, the first code conversion unit, when receiving a PCM signal, will convert the code of the PCM signal into an intermediate code which will be a linear PCM signal, whereas the rate conversion unit will effect the conversion of the PCM sampling rate into the delta sampling rate. The intermediate code at delta sampling rate will then be converted into the delta code through the second code conversion unit.

Above and other objects will become apparent through the following description of preferred embodiments of the invention, which is given with reference to the accompanying drawings, wherein.

Figure 1A:
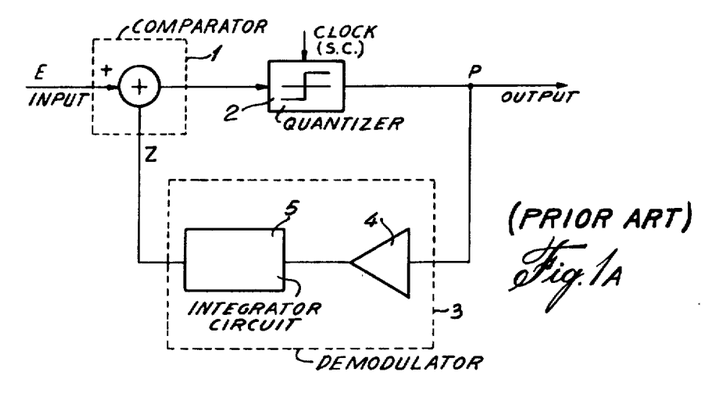
FIG. 1A is a block diagram showing a non-adaptive delta modulator, such modulator is known in the art.

Referring to FIG. 1A, there is shown a known delta modulation system, usually referred to as a delta coder, which is, generally a A/D converter. It is a closed loop or a feedback system whereby the slope variations of an analog input signal taken between two sampling periods are transmitted into a digitized signal. This digitized signal is reconstructed in a feedback loop which acts as a demodulator; this demodulator is the important part of the system and its design differentiates one coder from others.

As shown in FIG. 1A, an input analog signal E is compared to a reconstructed signal Z in a comparator 1. The difference or error signal $(E - Z)$ is then fed through a two-level quantizer 2, which is controlled by a sampling clock (S.C.). At each clock period, the quantizer 2 gives information on the sign of the error signal. Thus, the quantizer output is a $v$ (logic 1) if the error is positive and a $-v$ (logic 0) if the error is negative, $v$ being any voltage level determined by the quantizer. The sequence P of $v$ and $-v$ is then integrated in the feedback loop through the demodulator 3 which includes an amplifier 4 serially connected to an intergration network 5. Because the gain of the amplifier 4 is a static gain, the delta coder is said to be non-adaptive. The output signal Z of the demodulator 3 is a staircase signal which is generally referred to as the reconstructed signal.

Figure 1B:
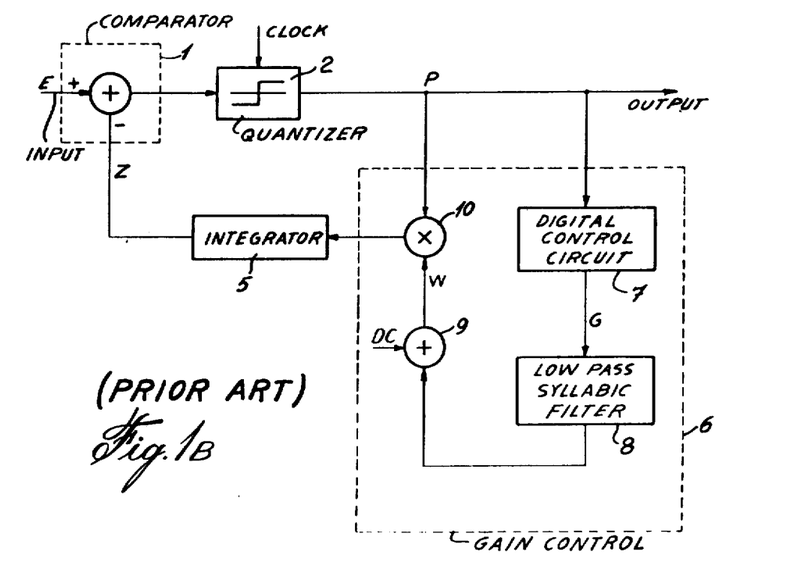
FIG. 1B shows a known delta modulator similar to the one illustrated in FIG. 1A, but capable of following the amplitude variation of the input signal, such a modulator is called a continuous variable slope delta modulator (CVSD)

FIG. 1B shows a delta coder of the adaptive type since the gain of the demodulator in the feedback loop is made variable in order to follow the amplitude or slope variation of the input signal. Such a system is known in the art as a continuous-variable-slope-delta (CVSD) modulation system.

In the CVSD, adaptation or companding is achieved through the past behaviour of the signal averaged over a rather long period of time, compared to the sampling period; the control is done with the digital description of the waveform (bit stream).

An incoming analog signal E is compared with a reconstructed analog signal Z by means of a comparator 1 which outputs either a logic 1 or a logic 0, depending on which of the signals E or Z is the larger. The result of this comparison is then clocked through the quantizer 2 and transmitted as the encoded digital output P.

The reconstructed analog signal Z is produced by integrating the digital output P which has been multiplied by a weighting factor W provided by a gain control 6 incorporated thereon in order to produce a more accurate profile of the analog signal E. This weighting factor is initiated by detecting at least three-like and consecutive bits in the binary sequence P, by means of a digital control circuit 7. Upon this detection, a signal G is produced and furtheron filtered through a syllabic low-pass filter 8 (usually at 25 Hz). The output of the syllabic filter 8 is a continuous signal which is added through adder 9 to a DC voltage to increase the amplitude of the filter output and to improve its signal-to-noise ratio, and thereafter mixed through multiplier 10 to the output digital signal P to obtain a delta step which is then integrated by means of integrator 5.

An important point with respect to gain control 6 is that the digital control circuit 7 is controlled by a three-bit memory (A, B and C), whereby the following control logic is performed:

$$G = ABC + \overline{ABC}$$

The delta decoder (not shown) is like the coder except that there is no comparator. The incoming digits are clocked and then integrated. Like the coder, the weighting factor is also incorporated. The net result is an audio output signal exactly like the coder's reconstructed audio signal. This signal is then filtered through a fourth order low pass filter to eliminate excess quantizing noise and out-of-band noises.

Let us introduce, for sake of completeness, the pulse code modulation (PCM) system which is indeed widely used in telephony. A PCM system, in general, embodies several basic processes such as sampling, quantizing, pulse shaping (coding) and decoding. According to the sampling theorem a band limited function can be reconstructed from samples provided at a rate exceeding twice the highest modulating frequency. The amplitude of those samples are represented by certain discrete predetermined levels, and this is called quantizing. Any one quantized signal sample is coded into a group of $n$ pulses that are sent on the transmission line.

On the other hand, companding techniques are widely used in PCM systems designed by speech signal transmission. The companding techniques allow a reduction of the bit rate usually necessary for transmitting a signal, and that without decreasing the entropy and the objective quality (signal-to-noise ratio). The three well known PCM companding laws used for speech transmisson are the $\mu = 100$, 7 bits;
$\mu = 255$, 7 or 8 bits; and
A-law, 7 or 8 bits.

The PCM system usually uses a sampling frequency for the audio signal of 8 kHz.

As seen from above, delta modulation and PCM are two different manners of digitally representing an analog signal. Both transmit only samples of the analog input signal and thus the information on this signal is available only at specific sampling time. Those two modulation methods, however, differ in many respects: they do not use the same digital code to transmit the information on the samples, and furthermore their sampling rate is different.

Therefore, a delta decoder receiving a PCM sequence is unable to reconstruct the analog signal since, as the sampling rate is different, the delta decoder is not looking for the information at the right time, and, as the codes are different, it cannot "understand" the meaning of the binary words it is receiving.

Consequently, to interface between PCM and delta systems, a digital converter for converting a PCM signal to a CVSD signal is required. Such a converter will be hereafter designated as a DDMC.

Figure 2:
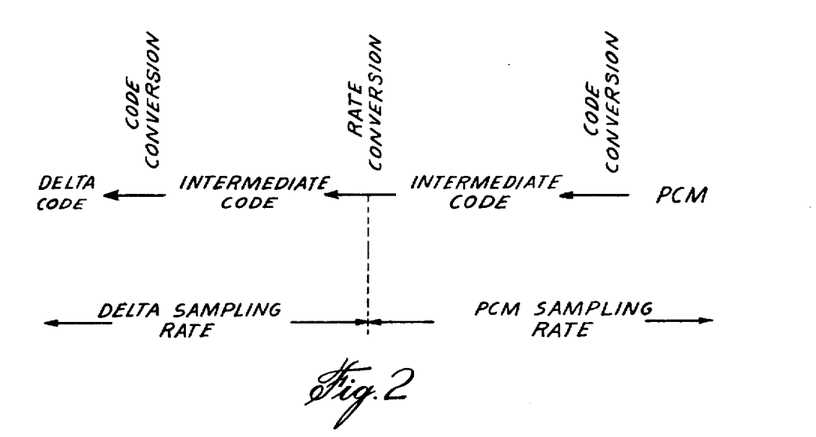
FIG. 2 depicts a method for converting a PCM signal from a PCM modulation system into a delta signal, in accordance with the present invention.

Thus, to render a PCM system compatible with a CVSD system, the DDMC has to realize a code conversion and a sampling rate conversion. As shown in FIG. 2, this is done by using an intermedite binary code which permits an effective code conversion from PCM to delta. The sampling rate conversion is made at that coding level.

The selected intermediate code is a linear binary representation of the signal amplitude (linear PCM). It permits rate conversion by means of interpolation methods.

The general principle of the DDMC in accordance with the present invention is shown in FIG. 2. The first step consists in effecting a code conversion at PCM sampling rate of a PCM code word (compressed PCM) into a linear PCM code word to obtain an intermediate code which is produced at the PCM sampling rate (usually at a frequency of 8 kHz.). But, a code word at the delta sampling rate is required. Since the output delta code usually uses a sampling rate several times that of the PCM rate, a rate conversion from the PCM sampling frequency up to the delta sampling frequency is effected. Thereafter, the intermediate code words are available at delta sampling rate. The last conversion is effected to transform the intermediate code word (linear PCM) into the output delta word.

Figure 3:
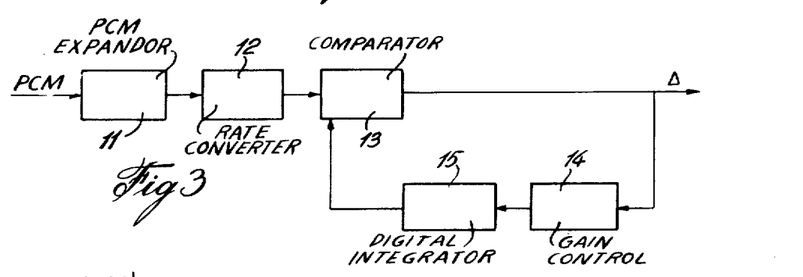
FIG. 3 shows the system of the invention capable of carrying out the PCM to delta conversion method illustrated in FIG. 2.

Referring to FIG. 3, there is shown a block diagram of the PCM to delta DDMC according to the invention which realize the convertion system generaly described in FIG. 2. The DDMC system illustrated is completely digital. It is working with sample signals expressed in binary form. Thus, once per sampling period each block shown in FIG. 3 receives a binary number, having an input value, and uses it to provide an output value which is also a binary number.

Keeping in mind the general principle of the present invention (FIG. 2), the code conversion, from compressed PCM to linear PCM at PCM sampling: rate, in order to produce the intermediate code is made by means of a PCM expander 11. A rate converter 12 performs the rate conversion of the intermediate word, from PCM to delta sampling frequencies. Thus, the intermediate word at delta rate is fed to a comparator 13 which realizes together with a gain control 14 and a digital integrator 15, located in the feedback loop, the conversion from intermediate to delta codes. At each delta sampling time, the intermediate code word is compared to the binary word generated by the feed-back loop (gain control and the integrator). A delta bit one or zero is produced depending on the result of the comparison (positive or negative result). This delta bit is available for transmission and is also fed in the feedback loop. With this information, the gain control circuit 14 and the digital integrator 15 determine the value of the reconstructed signal.

The gain control circuit 14 is a logic circuit which utilizes an alogarithm similar to the alogarithm of the delta modulator. Using the delta sequence, it generates once per delta period a binary word which represents the value of the delta step at this instant. The digital integrator 15 is another logic circuit which determines the amplitude of the reconstructed signal by adding the delta steps values. It is a digital addition and the output is a binary word.

As mentioned above, the rate increase from PCM frequency (around 8 kHz) up to delta frequency (38.4, 32.0 or 19.2 kHz) is made by the rate converter 12. At the input of the converter, the amplitude of the voice signal (intermediate code word) is known at each PCM sampling instant. The converter 12 is a logic circuit which generates an intermediate code word at each delta sampling time. The circuit complexity depends on the delta sampling rate. When the delta rate is not an integer multiple of the PCM rate, the delta sampling time is generally between two PCM sampling times and as the value of the intermediate code is known only at PCM sampling time, the value at delta sampling time must be estimated by an interpolation method. The interpolation means depends on the system signal-over-noise ratio (i.e. depends on the type of delta modulation and on the sampling frequency). When possible without degrading the system performance, a "zero-order digital holder" is used. In this case the latest available value is stored (held) and used when needed. When a higher quality is necessary, a "linear interpolation" is used.

Such interpolation adds noise to the system and in some cases a low-pass digital filter (cut-off frequency around 3.5 kHz) must be placed after the interpolator to remove excessive out-of-voice-band noise.

Figure 4:
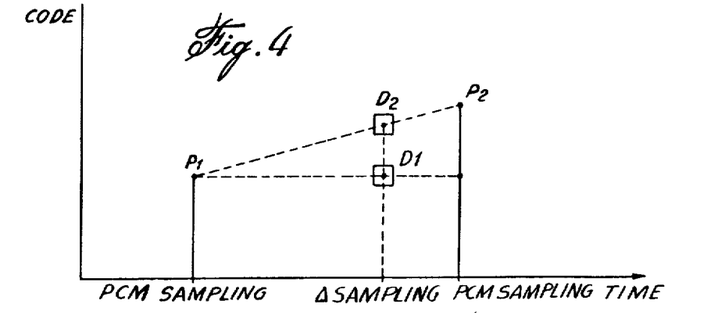
FIG. 4 shows a method of interpolation between two PCM samples.

FIG. 4 shows a diagram of such interpolation methods wherein $P_1$ and $P_2$ are two successive code words at PCM sampling time. $D_1$ and $D_2$ are two different estimates of the code value at delta sampling time. $D_1$ is obtained by zero-order holding and $D_2$ by linear interpolation, as discussed above.

Figure 5:
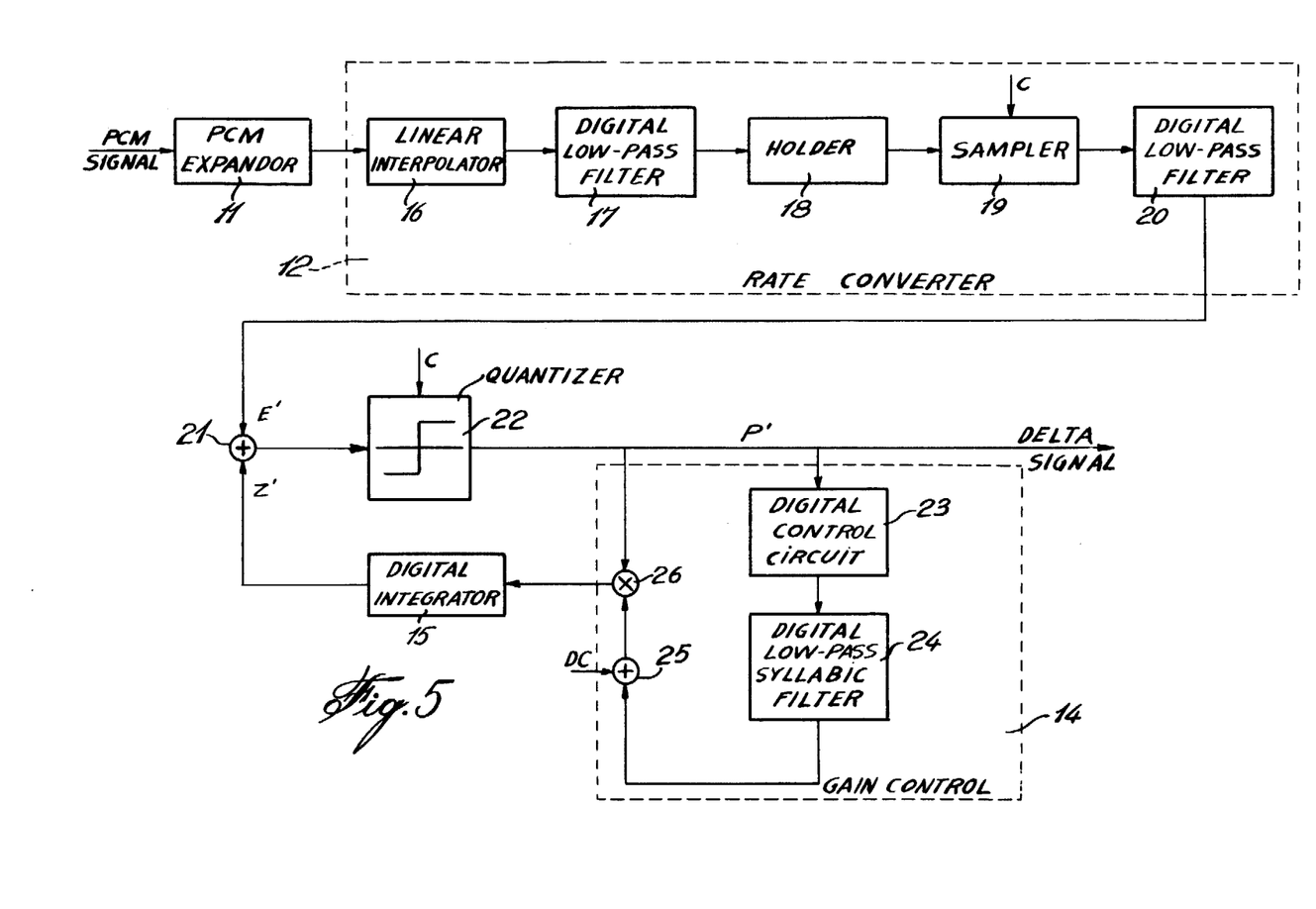
FIG. 5 is a detailed block diagram of the PCM to CVSD converter shown in FIG. 3.

FIG. 5 more elaborately illustrates the DDMC of the invention shown in FIG. 3. The compressed PCM sequence is fed to the PCM expander 11 to produce the linear PCM word which is the intermediate code at PCM rate. Such digital expander is, for instance, described in U.S. Pat. No. 3,694,639 issued in September 1972 to Deschenes et al, or in U.S. Pat. No. 3,863,248 issued on Jan. 28, 1975 to Villeret et al.

The rate converter 12 must increase the sampling rate of the intermediate code from 8 kHz to the delta sampling frequency (16, 19.2, 32 or 38.4 kHz for example). This rate converter 12 consists of a linear interpolator 16 which increases the intermediate code frequency from 8 kHz to 64 kHz, a digital low-pass filter 17 of the second-order type, a zero-order holder 18, a sampler 19 driven by a delta clock C and a digital low-pass filter 20 of the first-order type which smoothes the stair-case type signal produced by the holder 18. Thus, the rate converter 12 will produce at its output an intermediate code word flowing at the desired delta rate. The holder and samplers used in the present arrangement are individually readily available in the market, for example, from Datel Systems, Inc., Canton, Mass., U.S.A., whereas operation of the interpolator 16 is extensively described in a book titled "Sample-Data Control Systems" by Ragazzini and Franklin, McGraw-Hill, New York, U.S.A.

Then, the code of the intermediate signal is converted into a delta code by comparing through a comparator 21 the value of the intermediate word E' to the value of the digital number Z' produced by the code comverter feedback loop. The comparator 21 outputs either a logic 1 or a logic 0 depending on which of the signals E' or Z' is the larger. The result of this comparison is then clocked through the quantizer 22 and transmitted as the encoded digital output P'.

The reconstructed signal Z' is produced by integrating through the digital integrator 15 the digital output P' which has been multiplied by a weighting factor provided by the gain control circuit 14 incorporated thereon in order to produce a more accurate profile of the signal E'. The gain control circuit 14 includes a digital control circuit 23 connected to a digital low-pass syllabic filter 24 the output of which is multiplied by means of a multiplier 26 to the outgoing delta sequence after having been added at 25 to a DC voltage for improving the signal-to-noise ratio and the amplitude of the signal from the filter 24. It is to be noted that the control circuit 23 is similar to the control circuit 7 used in the CVSD coder described in FIG. 1B. The digital syllabic filter 24 is used to smoothen the digital output of the control circuit 23.

The digital integrator 15 is a digital first-order low-pass filter having a low cut-off frequency. This integrator digitally integrates all the binary numbers received from the digital control circuit and produces, once per delta sampling period, a binary number which represents the sum of all the delta steps. The output signal P' is thus the desired delta signal (FIG. 2).

Figure 6:
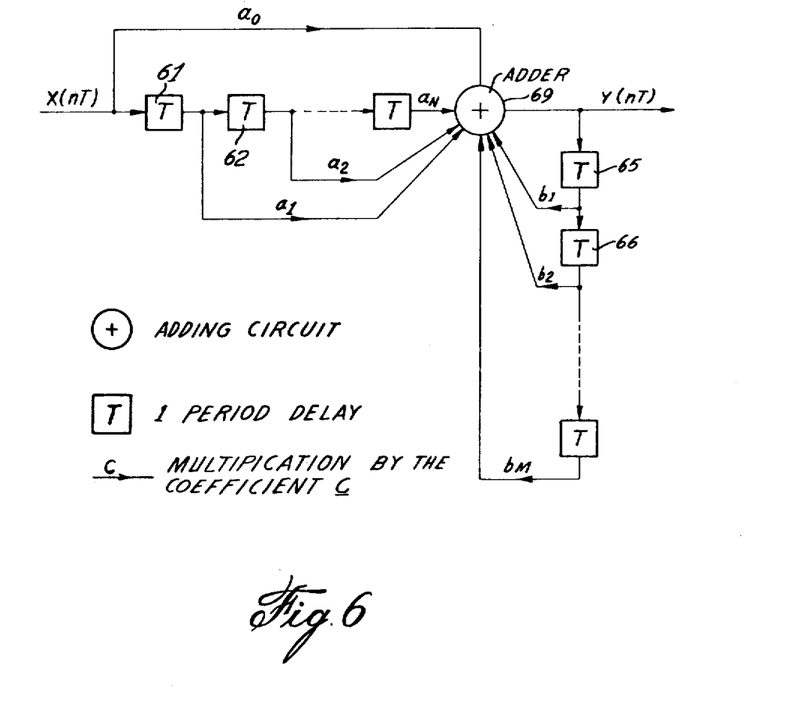
FIG. 6 generally illustrates a digital filter of the type used in the system of FIG. 5.

As digital filters are widely used in the present invention, we will briefly indicate the general structure of those filters with reference to FIG. 6.

Digital filtering is the process of spectrum shaping using digital hardware. The aims of digital filtering are the same as those of continuous filtering, but the processed signals are discrete instead of being continuous.

In a digital filter, the input and output signals are not represented by a continuous waveform but by samples. Usually, the sample values are given by binary members. Once per sampling period, the filter receives a signal sample and produces by means of digital logic operation an output sample.

The output sample ($Y(nT)$) of a digital filter at time $nT$ (sampling period T seconds) is computed from the input sample ($x(nT)$) and a linear combination of past inputs and outputs.

$$Y(nT) = \sum_{i=0}^{N} a_i x((n-i)T) + \sum_{i=1}^{M} b_i Y((n-i)T)$$

where $a_i$ and $b_i$ are constant coefficients. The above equation is called a finite difference equation.

The logic circuit which implements the operations of the above equation is schematically represented in FIG. 6.

The input sample $x(nT)$ is fed into a one period delay block and $x((n-1)T)$ is available at the output of this block. There are N such delay blocks 61, 62 . . . connected in tandem which provide the values of $x((n-1)T)$, $x((n-2)T)$, $x((n-N)T)$. Each of thse $x((n-i)T)$ ($i = 0$ to N) is multiplied by its weighting factor $a_1$. Similarly, M delay blocks 65, 66 provide the values of $y((N-i)T)$ ($i = 1$ to M) which are multiplied by the coefficients $b_i$. An adder 69 gives the output value $y(nT)$ by computting the sum of all these terms.

Once the theoretical values of the factors $a_i$ and $b_i$ have been computed, they had to be rounded in order to make the practical implementation as simple as possible. To minimize the hardware complexity and/or the operating times of the converter, the theoretical values of the filter coefficients have been changed to approximate values. Of course, the coefficient rounding modifies the filter frequency response and the amount of simplification is limited by the desired filter performance. It is to be noted that the filter characteristic is more sensitive to coefficient rounding when the sampling frequency is high. For this reason, coefficients are generally simpler at 19.2 kHz than at 32 or 38.4 kHz, for example.

Referring back to FIG. 5, the filters 15, 17, 20 and 24 are digital filters of a type as generally described above. More particularly, the Z transfer function of each of those filters are as follows:

a. the filter 17 is preferably a second-order filter, thus the transfer function is $$H(z) = 1/(1 - az^{-1}bz^{-2})$$

b. the digital filter 20 is preferably a first-order low-pass filter having the following transfer function $$H(z) = 1/(1 - cz^{-1})$$

c. the digital integrator or filter 15 is preferably of the first-order type with a transfer function $$H(z) = 1/(1 - dz^{-1})$$

d. the low-pass filter 24 is preferably of the first-order and has a transfer function $$H(z) = 1/(1 - ez^{-1})$$

As mentioned previously, the respective value of the coefficients $a$ to $e$ appearing in the transfer functions varies with the delta sampling frequencies and may be calculated following any appropriate method, such as the one given om "Digital Filter Design Techniques in the Frequency Domain", by Rader et al, published in the proceedings of the IEEE, Volume 55, February 1967. For example, the following coefficient values have been determined for various delta sampling rates, as shown in the following table.

| Δ sampling rates | | 16 kHz | 19.2 kHz | 32 kHz | 38.4 kHz |
|---|---|---|---|---|---|
| Filter coefficient values | a | 1.3125 | 1.3125 | 1.3125 | 1.3125 |
| | b | 0.5 | 0.5 | 0.5 | 0.5 |
| | c | 0.25 | 0.3125 | 0.5 | 0.5625 |
| | d | .9375 | 0.949219 | .970703 | .972656 |
| | e | .984375 | .988281 | .992920 | .99414 |

The DDMC is made of a combination of digital filters. Digital filtering involves binary additions and substractions, and the storage of samples which are used during several consecutive periods. Additions and subtractions can be parallel or serial operations. Parallel adders are the fastest and permit to use the same circuit to make several successive additions. Serial adders are much slower and thus cannot perform as many additions as parallel circuits, during a given period of time. Samples can be stored in registers with parallel inputs and outputs or in shift registers (serial inputs and outputs). Naturally, shift-registers are preferred for serial operations, and parallel input registers for parallel operations.

Therefore, parallel and serial arithmetic circuits result in two different ways to implement the DDMC. Methods of implementing digital filters are taught, for example, in a book titled "Digital Signal Processing", by Rader and Robiner, page 118 to 125 and 144, 1972, IEEE Press, New York, U.S. A.

In the following, we will present a design example of the CVSD DDMC using serial structure. As the circuit is similar at any delta frequencies we will only present schematics of the CVSD DDMC for a 32 kHz delta.

Figure 7:
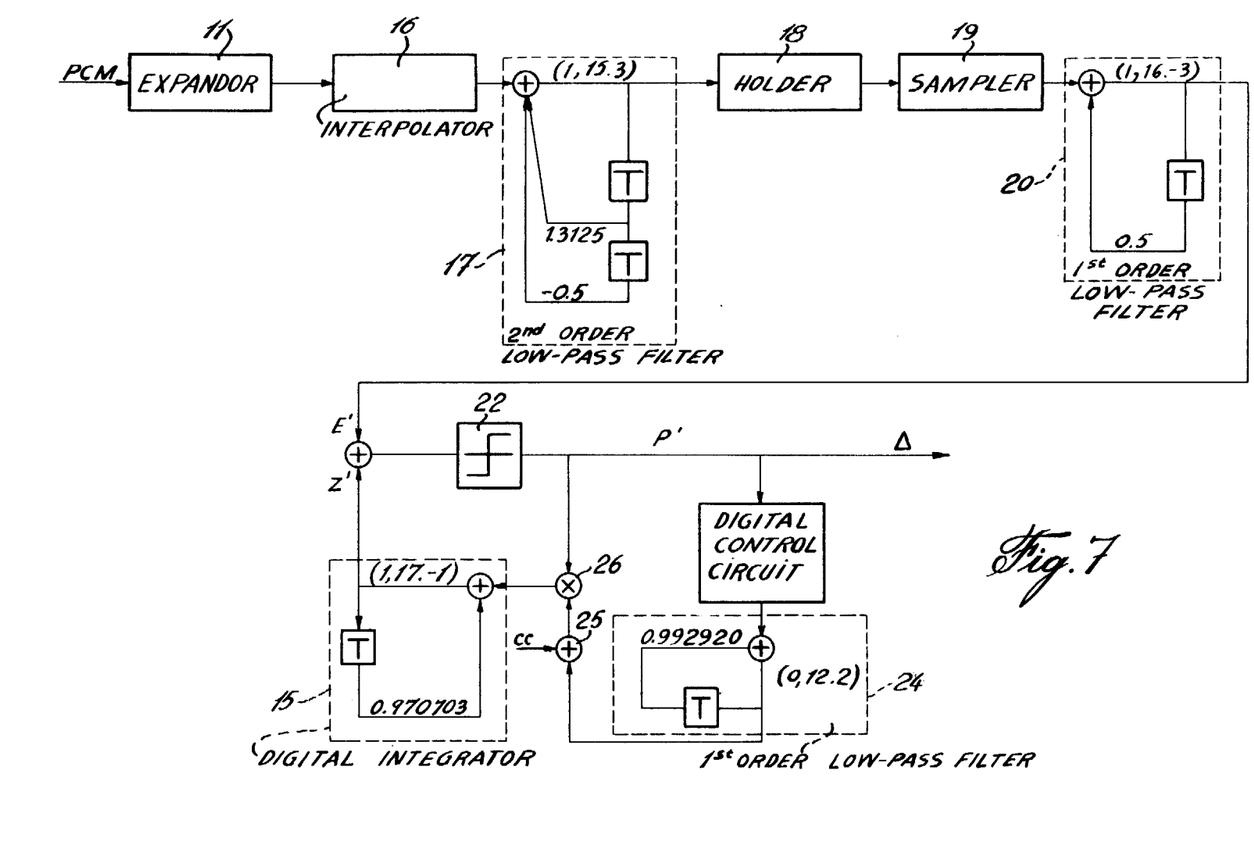
FIG. 7 shows the implementation diagram of the DDMC of the invention.

FIG. 7 gives the complete schematics of the CVSD DDMC for a 32 kHz sampling rate. Binary word lengths are indicated for each filter by numbers in parenthesis. The following conventions are used: $(a, b.c)$ $a$: indicates if a sign bit is needed (it is not needed for the envelope signal which is always positive).

$a = 1$ request a sign bit $a = 0$ means that a sign bit is not necessary.

$b$: indicates the numbers of bits on the left side of the binary point.

$c$: indicates the number of bits on the right side of the binary point. $c$ can be negative. This means that there is no bit on the right side of the binary point and that the truncation is made on the left side up to the bit of weight $2^{-c}$:

EXAMPLES (1,4.2) indicates a word which is either positive or negative, which maximum value is:

$$2^3 + 2^2 + 2^1 2^0 + 2^{-1} + 2^{-2} = 15.75$$

and which smallest value different from zero is:

$$2^{-2} = 0.25$$

Total number of bits: $1 + 4 + 2 = 7$ (0,5.3): always positive; maximum value:

$$2^4 + 2^3 + 2^2 + 2^1 + 2^0 + 2^{-1} + 2^{-2} + 2^{-3} = 31.875$$

minimum value:

$$2^{-3} = 0.125;$$

Total number of bits: $0 + 5 + 3 = 8$

For a better understanding of FIG. 7, we will hereinafter explain in detail how a filter of the first-order type is implemented.

Figures 8, 9:
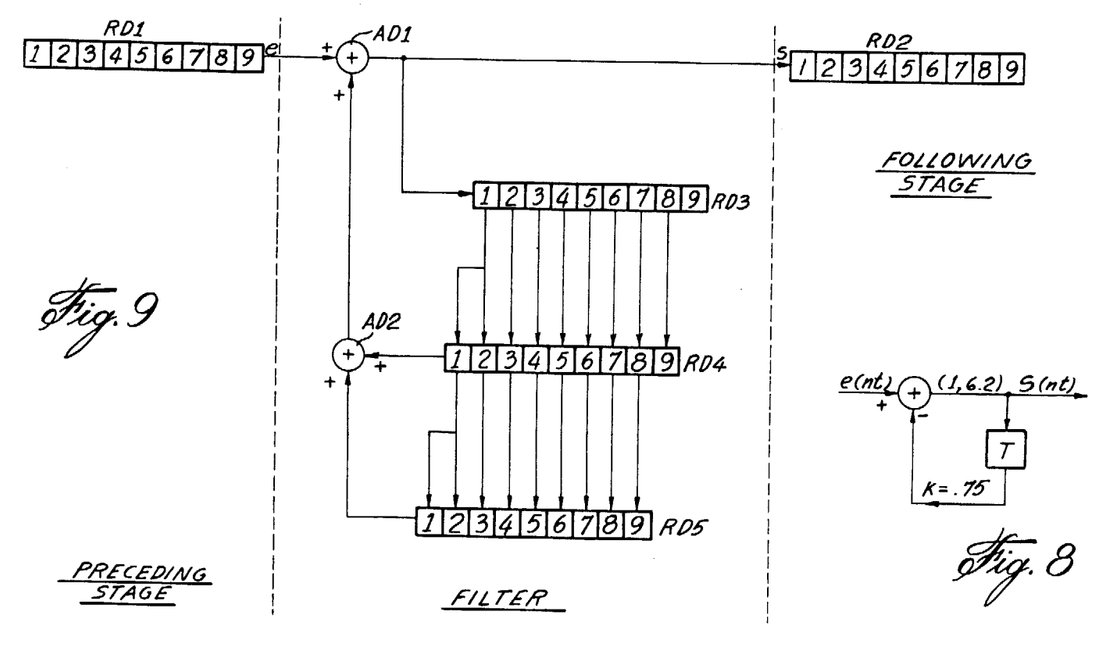
FIG. 8 represents symbolically a digital first order filter.
FIG. 9 shows a realization of the digital filter of FIG. 8.

FIG. 8 shows a first order filter wherein the symbol .75 with the arrow under indicates a multiplication by a constant $k$ equal to 0.75, while a T inside the blocks is to indicate a one period delay of the sampling period T. The signal $S(nT)$ is delayed by one period by the delay element to give $S(nT - T)$. Hence, in the example, the output at a sampling period $nT$ is:

$$S(nT) = e(nT) + 0.75\ S(nT - T)$$

Therefore, in the light of the above equation, the operations to be performed are:

1. multiply $S(nT - T)$ by K;
2. add $K\ S(nT - T)$ to $e(nT)$; and
3. store the result $S(nT)$ into a memory in order to use it one period later as $S(nT - T)$.

These operations may be realized through the circuit shown in FIG. 9, wherein, for example, binary adders of the serial type are used and the values $e(nT)$ and $S(nT)$ are represented in binary form by a two's complement code.

Thus, the code 1,6.2 shown in FIG. 8, indicates that each binary word has $1 + 6 + 2 = 9$ bits, the first bit being the sign.

The input $e(nT)$ is from a shift register RD1 located in a preceding stage. At each sampling period, RD1 sends the 9 bits representative of $e(nT)$ one after the other into the adder AD1.

The output $S(nT)$ is fed to the shift register RD2 of the following stage and also into a shift register RD3 where it is stored in a memory to give $S(nT - T)$ for the following period.

To realize the multiplication K. $S(nT - T)$, it is noted that $K = 0.75$, which is 0.11 in binary. We therefore obtain:

$$K\,S(nT - T) = 0.11S(nT - T) = 0.1S(nT - T) + 0.01S(nT - T)$$

And as a binary multiplication by 0.1 corresponds to one shifting to the right, while a multiplication by 0.01 corresponds to two shiftings to the right, it is only necessary to shift the content of RD3 by one position while transferring into RD4, and further into RD5 through shifting it by one more position to obtain:

$$0.1S(nT - T) \text{ and } 0.01S(nT - T)$$

Then the content of RD4 is added to the one of RD5 by AD2 to give $KS(nT - T)$.

The foregoing is only an example of a serial implementation. It is possible by modifying slightly the principle of operation to decrease the number of shift registers required.

Figure 10:
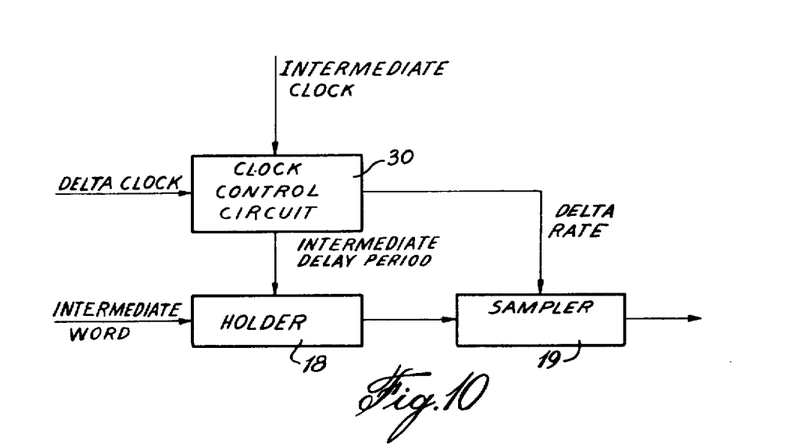
FIGS. 10 and 11 show a clock control circuit also of the invention.
Figure 11:
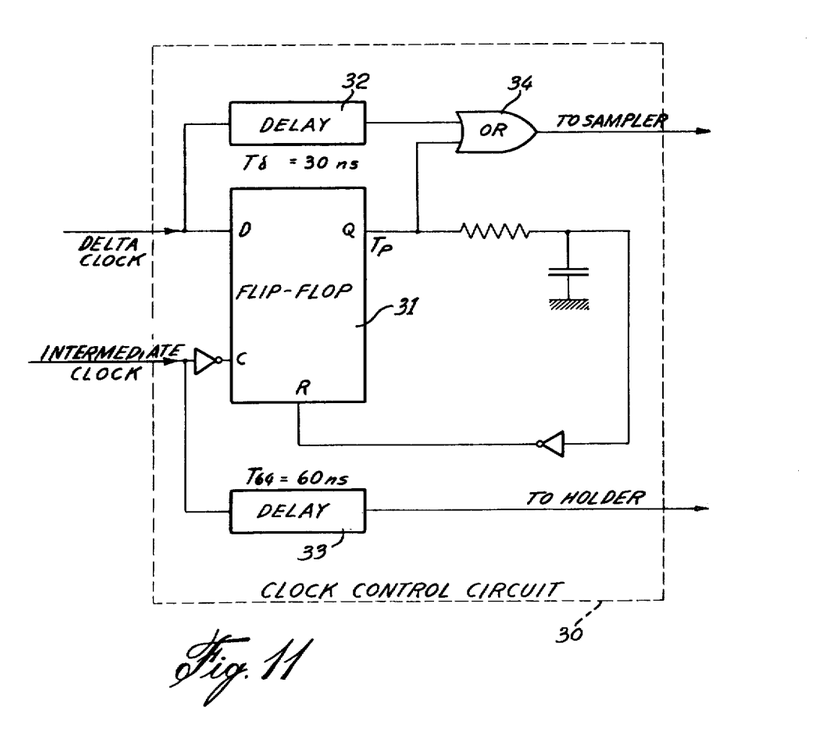

Now, referring generally to FIGS. 10 and 11, there is shown a further embodiment of the present invention which consists in providing a clock control circuit between the holder 18 and the sampler 19 (see FIG. 5) for synchronizing the sampling time of the intermediate clock (usually at 64 kHz) and the DDMC delta clock. Indeed, such snchronization will prevent the reading by the sampler 19 of two intermediate words at one sampling instant. This situation may happen, for instance, each time a wod is entering into the holder while the preceding word is being shifted out. Then, the information contained in both words may be lost since the sampler is not able to see which one of these two words was first registered in one holder. Therefore, in order not to alter the binary word, the clock control circuit 30 has been devised.

Thus, the delta clock and the intermediate clock are simultaneously applied to the input D and C, respectively, of a flip-flop 31; this flip-flop will make the decision whether to delay or not the signal from the delta clock by generating a pulse Tp at its Q output. Then, the pulse Tp is added to the delta clock signal, which has been delayed by a delay circuit 32, by means of an OR gate to feed the sampler 19. In order to prevent any coincidence between the sampling time of the clocks, the intermediae clock signal is also delayed through delay circuit 33 of a time period preferably double that provided by the delay circuit 32. Consequently, only one word registered in the holder may be read by the sampler at once.

The same above principle may be used when converting the PCM rate into the intermediate rate. However, by choosing a multiple of the PCM rate as an intermediate frequency, for instance an intermediate frequency of 64 kHz when the PCM rate is at 8 kHz, the clocks are rendered synchronous.

We claim:

1. A digital converter for converting a compressed pulse code modulation (PCM) signal provided from a pulse code modulation system and being at a predetermined rate into a delta signal flowing at a delta rate, said delta signal being supplied to a delta modulation telecommunication system, comprising:
   a. a first conversion means receiving said compressed PCM signal for converting the code thereof into a intermediate code, said intermediate code being at a rate corresponding to said PCM rate;
   b. a second conversion means connected to said first conversion means for converting the rate of said intermediate signal into the delta rate; and
   c. a third conversion means fed with said intermediate signal at said delta rate for converting the code thereof into the code of the delta signal, said third conversion means comprising:
      a comparator for comparing the intermedite signal at the delta rate with a feedback signal and for providing an output signal,
      a quantizer connected to receive the output signal of said comparator, said quantizer having an output for providing said delta signal at the delta rate, and
      means connected between the output of said quantizer and the comparator for providing said feedback signal to said comparator.

2. A digital converter as claimed in claim 1, wherein said first conversion means ia a pulse code modulation expandor.

3. A digital converter as claimed in claim 1, wherein said second conversion means includes an interpolator for sampling the intermediate signal at a predetermined sampling rate, a low-pass filter connected to said interpolator, a holder receiving the output of said filter for storing the intermediate signal during a time equal to one period of said predetermined sampling rate, a sampler connected to said holder for sampling the output of the low-pass filter at said delta rate, and another low-pass filter connected to said sampler for filtering quantizing and out-of-band noises,.

4. A digital converter as claimed in claim 3, wherein a clock control circuit is provided for synchronizing the signal holding time of said holder to the sampling rate of said sampler, said control circuit including a flip-flop circuit simultaneously receiving a signal at said predetermined sampling rate and another signal at said delta rate, an OR gate for adding said signal at the delta rate to an output of said flip-flop circuit, the output of said gate being applied to the sampler while the signal at said predetermined sampling rate is applied to said holder.

5. A digital converter as claimed in claim 4, wherein said clock control circuit further includes a first delay circuit inserted before said gate and a second delay circuit inserted before said holder, said first circuit having a time delay which is half of the time delay of said second circuit.

6. A digital converter as claimed in claim 1, wherein said means for providing said feedback signal comprises a gain control which receives said delta signal from said quantizer and a digital integration circuit connected to said gain control circuit for digitally integrating all binary numbers received from the gain control circuit and for producing once per delta-sampling-period a binary number which represents the sum of all delta steps.

7. A digital converter as claimed in claim 6, wherein said gain control circuit includes a digital control circuit receiving said delta signal, a digital low-pass syllabic filter connected to the output of said digital control circuit, and a multiplier for weighting the output delta signal with the output of said syllabic filter.

8. A digital converter as claimed in claim 7, wherein the digital control circuit is controlled by a three-bit memory.

9. A digital converter as claimed in claim 6, wherein the digital integration circuit is a logic circuit which reconstructs the amplitude of the information contained in the intermediate signal at delta rate.

10. A digital converter for converting a compressed pulse code modulation (PCM) signal provided from a pulse code modulation system and being at a predetermind rate into a delta signal flowing at an adaptive delta rate, said delta signal being supplid to a delta modulation telecommunication system, comprising:

a. a first conversion means receiving said compressed PCM signal for converting the code thereof into an intermediate code, said intermediate code being at a rate corresponding to said PCM rate;
b. a second conversion means connected to said first conversion means for converting the rate of said intermediate signal into the delta rate, said second conversion means including an interpolator for sampling the intermediate signal at a predetermined sampling rate; and
c. a third conversion means fed with said intermediate signal at said delta rate for converting the code thereof into the code of the delta signal, said third conversion means comprising:

a comparator for comparing the intermediate signal at the delta rate with a feedback signal and for providing an output signal, a quantizer connected to receive the output signal of said comparator, said quantizer having an output for providing said delta signal at the delta rate, and means connected between the output of said quantizer and the comparator for providing said feedback signal to said comparator.

* * * * *